United States Patent
Bizen et al.

(10) Patent No.: US 11,456,150 B2
(45) Date of Patent: Sep. 27, 2022

(54) CHARGED PARTICLE BEAM DEVICE

(71) Applicant: Hitachi High-Tech Corporation, Tokyo (JP)

(72) Inventors: Kaori Bizen, Tokyo (JP); Yuzuru Mizuhara, Tokyo (JP); Minoru Yamazaki, Tokyo (JP); Daisuke Bizen, Tokyo (JP); Noritsugu Takahashi, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 2 days.

(21) Appl. No.: 17/210,805

(22) Filed: Mar. 24, 2021

(65) Prior Publication Data
US 2021/0313140 A1 Oct. 7, 2021

(30) Foreign Application Priority Data
Apr. 1, 2020 (JP) .............................. JP2020-065591

(51) Int. Cl.
*H01J 37/244* (2006.01)
*H01J 37/28* (2006.01)
*H01J 37/22* (2006.01)

(52) U.S. Cl.
CPC .......... *H01J 37/244* (2013.01); *H01J 37/222* (2013.01); *H01J 37/28* (2013.01);
(Continued)

(58) Field of Classification Search
CPC .......... H01J 37/00; H01J 37/02; H01J 37/244; H01J 37/222; H01J 37/22; H01J 37/24;
(Continued)

(56) References Cited

U.S. PATENT DOCUMENTS 5,900,629 A * 5/1999 Todokoro .............. H01J 37/268
250/397
2015/0014531 A1 1/2015 Yamazaki et al.
(Continued)

FOREIGN PATENT DOCUMENTS

JP 5948084 B2 7/2016

*Primary Examiner* — Jason L McCormack
(74) *Attorney, Agent, or Firm* — Crowell & Moring LLP

(57) ABSTRACT

A charged particle beam device capable of generating an image having uniform image quality in a field of view is provided. The charged particle beam device includes: a beam source configured to irradiate a sample with a charged particle beam; a diaphragm including an opening used for angle discrimination of secondary charged particles emitted from the sample; a first detector provided closer to the sample than the diaphragm, and configured to detect a part of the secondary charged particles; a second detector provided closer to the beam source than the diaphragm, and configured to detect secondary charged particles passing through the opening; an image generation unit configured to generate an image based on a first signal output from the first detector or a second signal output from the second detector; and a composite ratio calculation unit configured to calculate a composite ratio for each position in a field of view based on the first signal or the second signal with respect to a calibration sample that is a sample having a flat surface. The image generation unit generates a composite image by synthesizing the first signal and the second signal with respect to an observation sample using the composite ratio.

5 Claims, 10 Drawing Sheets

(52) U.S. Cl.
CPC . *H01J 2237/141* (2013.01); *H01J 2237/2448* (2013.01); *H01J 2237/2826* (2013.01)

(58) Field of Classification Search
CPC .. H01J 37/28; H01J 37/10; H01J 37/26; H01J 2237/141; H01J 2237/2448; H01J 2237/2826; H01J 2237/226; H01J 2237/221
USPC ............... 250/397, 306, 307, 311, 492.3
See application file for complete search history.

(56) References Cited

U.S. PATENT DOCUMENTS

| | | | |
|---|---|---|---|
| 2017/0301513 A1* | 10/2017 | Osaki | H01J 37/285 |
| 2017/0345615 A1* | 11/2017 | Zotta | G06K 9/6215 |
| 2020/0035448 A1* | 1/2020 | He | H01J 37/28 |

* cited by examiner

FIG. 2
IMAGE OF FIRST DETECTOR
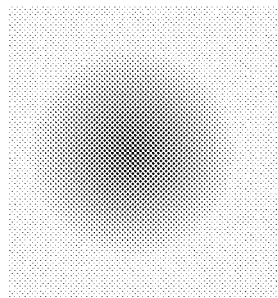
IMAGE OF SECOND DETECTOR
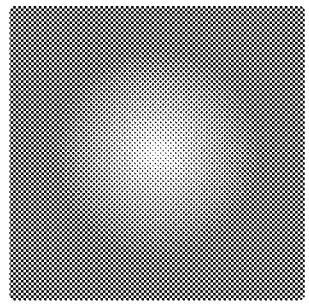

FIG. 6

| 100 | 100 | 100 | 100 | 100 | 100 | 100 | 100 | 100 | 100 | 100 |
|-----|-----|-----|-----|-----|-----|-----|-----|-----|-----|-----|
| 100 | 100 | 100 | 99  | 98  | 98  | 98  | 99  | 100 | 100 | 100 |
| 100 | 100 | 99  | 96  | 93  | 92  | 93  | 96  | 99  | 100 | 100 |
| 100 | 99  | 96  | 90  | 82  | 78  | 82  | 90  | 96  | 99  | 100 |
| 100 | 98  | 93  | 82  | 66  | 59  | 66  | 82  | 93  | 98  | 100 |
| 100 | 98  | 92  | 78  | 59  | 50  | 59  | 78  | 92  | 98  | 100 |
| 100 | 98  | 93  | 82  | 66  | 59  | 66  | 82  | 93  | 98  | 100 |
| 100 | 99  | 96  | 90  | 82  | 78  | 82  | 90  | 96  | 99  | 100 |
| 100 | 100 | 99  | 96  | 93  | 92  | 93  | 96  | 99  | 100 | 100 |
| 100 | 100 | 100 | 99  | 98  | 98  | 98  | 99  | 100 | 100 | 100 |
| 100 | 100 | 100 | 100 | 100 | 100 | 100 | 100 | 100 | 100 | 100 |

FIG. 10

| | OBSERVATION CONDITION | |
|---|---|---|
| 1001 | SAMPLE | WAFER A |
| 1002 | ACCELERATION VOLTAGE | 500 V |
| 1003 | PROBE CURRENT | 10 pA |
| 1004 | MAGNIFICATION | x 10k |
| 1005 | SCANNING TYPE | TV |
| 1006 | NUMBER OF FRAME | 32 |
| 1007 | COMPOSITE RATIO | 30 % |

1008 — Calibration ☑

CHARGED PARTICLE BEAM DEVICE

CLAIM OF PRIORITY

The present application claims priority from Japanese Patent Application JP 2020-065591 filed on Apr. 1, 2020, the content of which are hereby incorporated by references into this application.

BACKGROUND OF THE INVENTION

1. Field of the Invention

The present invention relates to a charged particle beam device, and more particularly, to a technique for generating a composite image having uniform image quality in a field of view.

2. Description of the Related Art

A charged particle beam device is a device that detects secondary charged particles such as secondary electrons emitted from a sample by irradiating the sample with a charged particle beam such as an electron beam, and generates an image for observing a fine structure of the sample, and is used in a manufacturing process of a semiconductor, or the like. In a semiconductor that is multilayered with miniaturization, secondary electrons emitted from a lower layer are blocked by a side wall and are difficult to be detected, and thus an image in which a shape of the lower layer is unclear may be generated.

U.S. Pat. No. 5,948,084 discloses that angle discrimination is performed by selectively detecting secondary electrons in accordance with directions in which the secondary electrons are emitted, so that an image in which a shape of a lower layer is clear is generated. In particular, when the angle discrimination is performed on the secondary electrons by using an opening through which an electron beam with which the sample is irradiated passes, detection efficiency of each of detectors provided above and below the opening is improved by deflecting the secondary electrons by two deflectors along the electron beam toward the opening. In addition, brightness of two images generated based on results detected by upper and lower detectors is multiplied and divided, and the other image is subtracted from one image, thereby generating a composite image in which a dynamic range of the brightness set at a desired observation position is widened.

However, in U.S. Pat. No. 5,948,084, a composite ratio used to generate the composite image is constant regardless of a position in the field of view. Since the detection efficiency of each of the detectors provided above and below the opening used for the angle discrimination varies depending on the position in the field of view, in a composite image generated by using a composite ratio that is constant regardless of positions of the two angle-discriminated images, the image quality in the field of view may become not uniform.

SUMMARY OF THE INVENTION

Here, an object of the invention is to provide a charged particle beam device capable of generating a composite image having uniform image quality in a field of view.

In order to achieve the above object, in the invention, a charged particle beam device includes: a beam source configured to irradiate a sample with a charged particle beam; a diaphragm including an opening used for angle discrimination of secondary charged particles emitted from the sample; a first detector provided closer to the sample than the diaphragm, and configured to detect a part of the secondary charged particles; a second detector provided closer to the beam source than the diaphragm, and configured to detect secondary charged particles passing through the opening; an image generation unit configured to generate an image based on a first signal output from the first detector or a second signal output from the second detector; and a composite ratio calculation unit configured to calculate a composite ratio for each position in a field of view based on the first signal or the second signal with respect to a calibration sample that is a sample having a flat surface. The image generation unit generates a composite image by synthesizing the first signal and the second signal with respect to an observation sample using the composite ratio.

According to the invention, it is possible to provide the charged particle beam device capable of generating an image having uniform image quality in a field of view.

BRIEF DESCRIPTION OF THE DRAWINGS

FIG. 2 is a diagram showing an example of images generated based on outputs of a first detector and a second detector.

FIG. 6 is a diagram showing an example of a composite ratio map.

FIG. 10 is a diagram illustrating a GUI according to a third embodiment.

DESCRIPTION OF THE PREFERRED EMBODIMENTS

Embodiments of a charged particle beam device according to the invention will be described below with reference to the figures. The charged particle beam device is a device that observes a sample by detecting secondary charged particles emitted from the sample irradiated with a charged particle beam. Hereinafter, a scanning electron microscope (SEM) that generates an image for observing a sample by scanning the sample with an electron beam will be described as an example of the charged particle beam device.

First Embodiment

Figure 1:
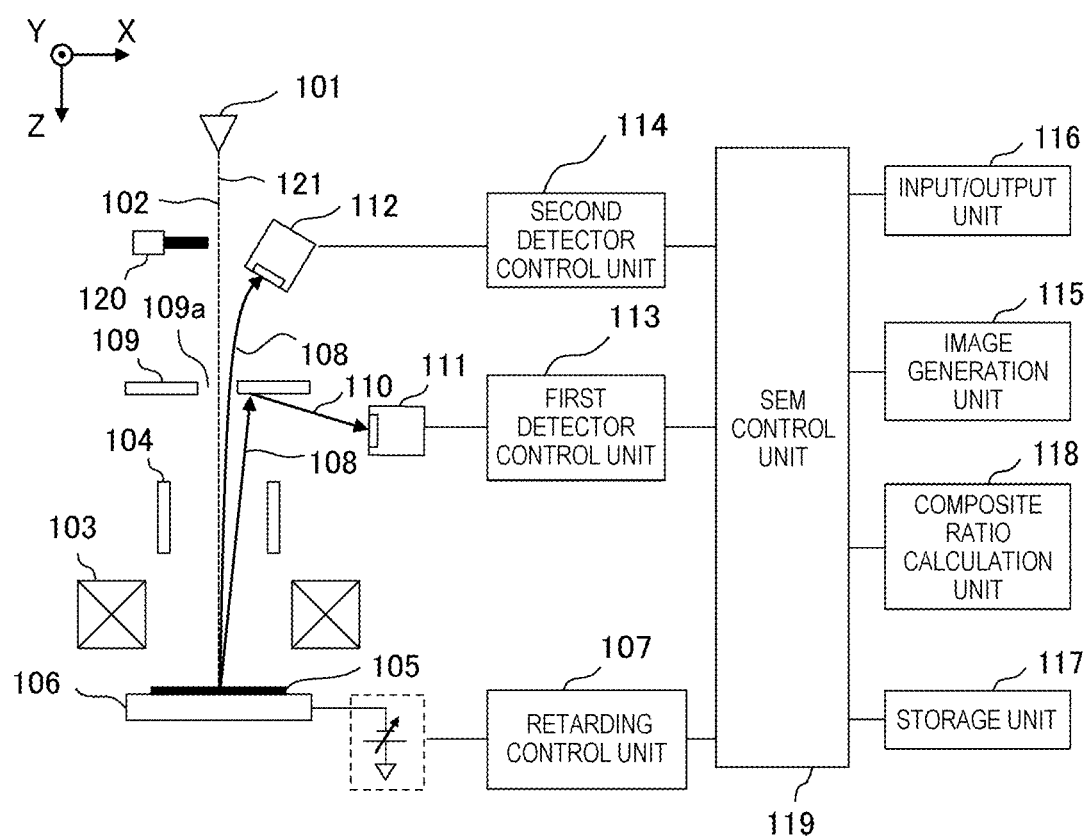
FIG. 1 is a schematic view showing an example of a scanning electron microscope according to a first embodiment.

An overall configuration of a scanning electron microscope of the present embodiment will be described with reference to FIG. 1. In FIG. 1, a vertical direction is defined as a Z direction, and horizontal directions are defined as an X direction and a Y direction. The scanning electron microscope includes an electron beam optical system that scans a sample with an electron beam, a stage mechanism system that holds the sample in a vacuum, a detection system that detects secondary electrons emitted from the sample by scanning the sample with the electron beam, and a control system that processes data output from each unit and controls each unit.

The electron beam optical system includes an electron beam source 101, an objective lens 103, a deflector 104, and a shutter 120. The electron beam source 101 is a beam source that irradiates a sample 105 with a primary electron beam 102 accelerated by a predetermined acceleration voltage. The objective lens 103 is a lens that converges the primary electron beam 102 on a surface of the sample 105. The deflector 104 is a coil or an electrode that generates a magnetic field or an electric field for deflecting the primary electron beam 102 in order to scan the surface of the sample 105. A straight line connecting the electron beam source 101 and a center of the objective lens 103 is referred to as an optical axis 121, and the sample 105 is irradiated with the primary electron beam 102 not deflected by the deflector 104 along the optical axis 121. The shutter 120 controls irradiation of the sample 105 with the primary electron beam 102 by mechanically opening and closing the optical axis 121, or electrically or magnetically deflecting the primary electron beam 102.

The stage mechanism system includes a movable stage 106. The movable stage 106 holds the sample 105 and moves the sample 105 in the X direction and the Y direction. A negative voltage lower than a ground voltage may be applied to the sample 105 held by the movable stage 106, and the primary electron beam 102 is subjected to a deceleration action by the applied negative voltage.

The detection system includes a secondary electron diaphragm 109, a first detector 111, and a second detector 112. The secondary electron diaphragm 109 is, for example, a metal plate including a circular opening 109a, and a part of secondary electrons 108 emitted from the sample 105 passes through the opening 109a. Since an angle formed by a direction in which the secondary electron 108 is emitted from the sample 105 and the optical axis 121 is relatively small, an angle of the secondary electrons 108 passing through the opening 109a is discriminated depending on whether the secondary electrons 108 pass through the opening 109a. That is, the opening 109a is used for angle discrimination of the secondary electrons 108 emitted from the sample 105. A position of the opening 109a may be matched with the optical axis 121, so that the primary electron beam 102 can pass through the opening 109a, or the opening 109a for the angle discrimination of the secondary electron 108 may be provided separately from a hole through which the primary electron beam 102 passes. Hereinafter, a case where the position of the opening 109a of the secondary electron diaphragm 109 matches with the optical axis 121 will be described.

The first detector 111 is a detector that is provided closer to the sample 105 than the secondary electron diaphragm 109 and detects a tertiary electron 110 generated by the secondary electron 108 colliding with the secondary electron diaphragm 109. That is, the first detector 111 indirectly detects the secondary electrons 108 that do not pass through the opening 109a of the secondary electron diaphragm 109 by detecting the tertiary electron 110.

The second detector 112 is a detector that is provided closer to the electron beam source 101 than the secondary electron diaphragm 109 and detects the secondary electrons 108 passing through the opening 109a. As the first detector 111 and the second detector 112, an E-T detector or a semiconductor detector including a scintillator, a light guide, and a photomultiplier tube may be used, or a detector having another configuration may be used. For example, the secondary electron diaphragm 109 may function as the first detector 111 by configuring the secondary electron diaphragm 109 with a circular ring shaped semiconductor detector or a micro-channel plate (MCP).

The control system includes a retarding control unit 107, a first detector control unit 113, a second detector control unit 114, an image generation unit 115, an input/output unit 116, a storage unit 117, a composite ratio calculation unit 118, and an SEM control unit 119. The retarding control unit 107 is a circuit that controls a negative voltage applied to the sample 105 on the movable stage 106. The first detector control unit 113 and the second detector control unit 114 are circuits that respectively control the first detector 111 and the second detector 112 to adjust gain and offset.

The image generation unit 115 is an arithmetic unit that generates an image based on a first signal output from the first detector 111 or a second signal output from the second detector 112, and is, for example, a micro processing unit (MPU), a graphics processing unit (GPU), or the like.

The input/output unit 116 is a device for inputting an observation condition, which is a condition for observing the sample 105, or for displaying an image generated by the image generation unit 115, and is, for example, a keyboard, a mouse, a touch panel, a liquid crystal display, or the like.

The storage unit 117 is a device in which various data and programs are stored, and is, for example, a hard disk drive (HDD), a solid state drive (SSD), or the like. The storage unit 117 stores a program executed by the SEM control unit 119 or the like, observation conditions received from the input/output unit 116, an image generated by the image generation unit 115, and the like.

The composite ratio calculation unit 118 is an arithmetic unit that calculates a composite ratio used when the image generation unit 115 synthesizes the first signal and the second signal to generate a composite image, and is, for example, an MPU. A flow of a process of calculating the composite ratio will be described later with reference to FIG. 3.

The SEM control unit 119 is an arithmetic unit that controls each unit and processes and transmits data generated by each unit, and is, for example, a central processing unit (CPU), an MPU, or the like.

An example of images generated by the image generation unit 115 will be described with reference to FIG. 2. FIG. 2 shows images respectively generated by the first detector 111 and the second detector 112 detecting the secondary electrons 108 emitted from the sample 105 having a flat surface. The secondary electrons 108 emitted from a vicinity of a center of a field of view pass through the opening 109a of the secondary electron diaphragm 109 and are detected by the second detector 112, whereas the secondary electrons 108 that collide with the secondary electron diaphragm 109 and are detected by the first detector 111 increase as the secondary electrons 108 are emitted toward a side edge of the field of view. As a result, in the image of the first detector 111, the vicinity of the center of the field of view is dark and the image becomes brighter toward the side edge, and in the image of the second detector 112, the vicinity of the center of the field of view is bright and the image becomes darker toward the side edge. When the two images shown in FIG. 2 are simply added, an image having uniform brightness is generated since the sample 105 has a flat surface.

In the present embodiment, in order to generate a composite image in which a shape of a lower layer of the multilayered sample 105 is clear and image quality in the field of view is uniform, a composite ratio used for composition of two images generated due to the angle discrimination is calculated for each position in the field of view. In the calculation of the composite ratio for each position in the field of view, a function indicating a luminance distribution, which is a distribution of brightness of an image with respect to a calibration sample that is the sample 105 having the flat surface, is used.

An example of a flow of a process of calculating a function used for calculating the composite ratio will be described for each step with reference to FIG. 3.

(S301)

The calibration sample, which is the sample 105 having the flat surface, is held on the movable stage 106 and carried into the scanning electron microscope. It is preferable that the calibration sample not only has the flat surface, but also is made of a homogeneous material. For example, a bare wafer made of silicon is used as the calibration sample.

(S302)

The first detector control unit 113 or the second detector control unit 114 adjusts the gain and the offset of the first detector 111 or the second detector 112. The gain and the offset are adjusted, so that luminance of the image generated by the image generation unit 115 is not saturated at an upper limit and a lower limit.

(S303)

The image generation unit 115 generates a noise image Img_0 based on an output from the first detector 111 or the second detector 112 in a state in which the irradiation of the primary electron beam 102 is stopped by the shutter 120. The noise image Img_0 is an image indicating a component of electrical noise of the first detector 111 or the second detector 112. The generated noise image Img_0 is stored in the storage unit 117.

(S304)

The SEM control unit 119 sets N=1 and opens the shutter 120 to start irradiating the calibration sample with the primary electron beam 102. Here, N is the number of images.

(S305)

The movable stage 106 moves the calibration sample, so that the flat surface is disposed in the field of view. When this step is repeated a plurality of times in a loop of S305 to S308, it is preferable that a position different from a position previously disposed in the field of view is disposed in the field of view.

(S306)

The image generation unit 115 generates an image Img_N of the calibration sample based on the output from the first detector 111 or the second detector 112. The generated image Img_N is an image as illustrated in FIG. 2, and at least one of the image of the first detector 111 and the image of the second detector 112 is generated. When this step is repeated a plurality of times in the loop of S305 to S308, an image of the same type as a previously generated image is generated. That is, when an image of the first detector 111 is generated last time, an image of the first detector 111 is also generated this time, and when two images of the image of the first detector 111 and the image of the second detector 112 are generated last time, two images thereof are also generated this time. The generated image Img_N is stored in the storage unit 117.

(S307)

The SEM control unit 119 determines whether a value of N is reached a predetermined threshold value Nth. When the value of N is not reached the threshold value Nth, the process proceeds to S308, and when the value of N is reached the threshold value Nth, the process proceeds to S309.

(S308)

The SEM control unit 119 updates the value of N by adding 1, and the process is returned to S305.

(S309)

The image generation unit 115 reads images Img_1 to Img_Nth from the storage unit, and generates an average image Img_ave of the images Img_1 to Img_Nth. The generated average image Img_ave is stored in the storage unit 117. In the average image Img_ave, fluctuation components of the primary electron beam 102, variation in flatness of the calibration sample, and the like are prevented.

(S310)

The image generation unit 115 generates a difference image Img_sub between the noise image Img_0 generated in S303 and the average image Img_ave generated in S309. The generated difference image Img_sub is stored in the storage unit 117.

(S311)

The composite ratio calculation unit 118 fits, that is, approximates, a luminance distribution of the difference image Img_sub generated in S310 by a designated function to obtain an approximate function. As a designated function f(x, y), for example, a Gaussian function as shown in the following equation is used.

$$f(x, y) = a - b \cdot \exp\left(-\frac{(x-e)^2}{c} - \frac{(y-f)^2}{d}\right) \qquad \text{Equation 1}$$

Figure 4:
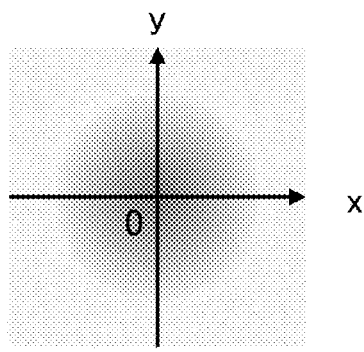
FIG. 4 is a diagram illustrating a coordinate system for an image.

Here, an origin of (x, y) is the center of the field of view, that is, a position of the optical axis 121, and is, for example, a coordinate system as illustrated in FIG. 4 with respect to the image of the first detector 111. A unit of x, y is a length, and is, for example, μm or nm. In addition, a, b, c, d, e, and f are coefficients of the Gaussian function and are calculated by fitting using a least-squares method or the like. Values of the coefficients a, b, c, d, e, and f calculated by the fitting are stored in the storage unit 117.

According to the flow of the process described above, in order to specify the designated function, for example, the coefficients a, b, c, d, e, and f included in Equation 1 are calculated based on the luminance distribution of the image of the first detector 111 or the second detector 112 with respect to the calibration sample. The designated function specified by these coefficients is used to calculate the composite ratio that is a ratio at which two angle-discriminated images generated for an observation sample which is the sample 105 to be observed, that is, the image of the first detector 111 and the image of the second detector 112 for the observation sample are synthesized.

Figure 5:
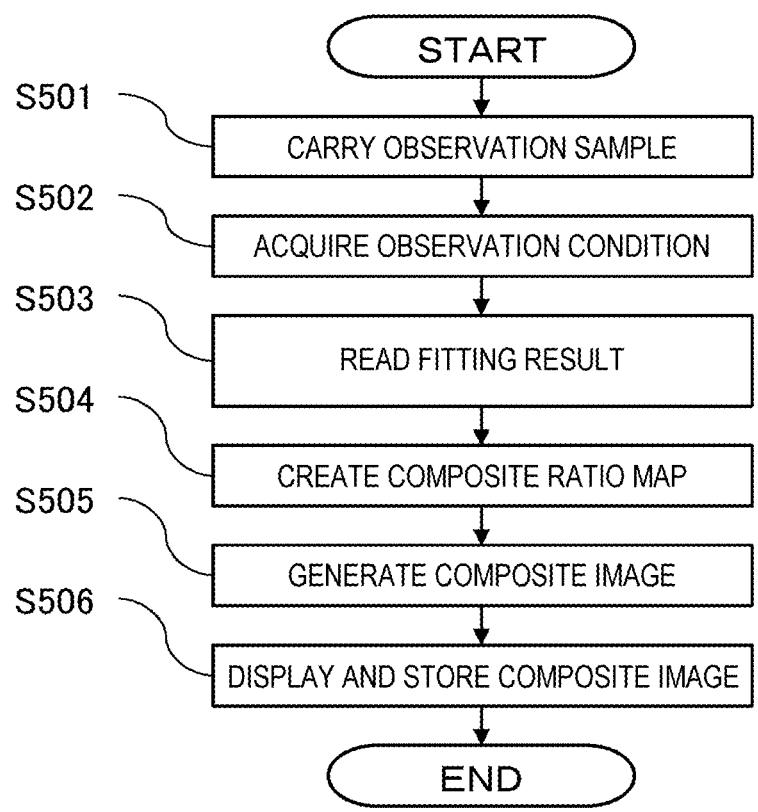
FIG. 5 is a diagram showing a flow of a process of generating a composite image according to the first embodiment.

An example of a flow of a process of generating a composite image of an observation sample will be described for each step with reference to FIG. 5.

(S501)

The observation sample, which is the sample 105 to be observed, is held on the movable stage 106 and carried into the scanning electron microscope.

(S502)

The SEM control unit 119 acquires the observation conditions for the observation sample. The observation condition is, for example, a magnification of an image or the number of pixels, and is input by an operator via the input/output unit 116. A condition that is determined in advance according to a type of the observation sample is read from the storage unit 117.

(S503)

Figure 3:
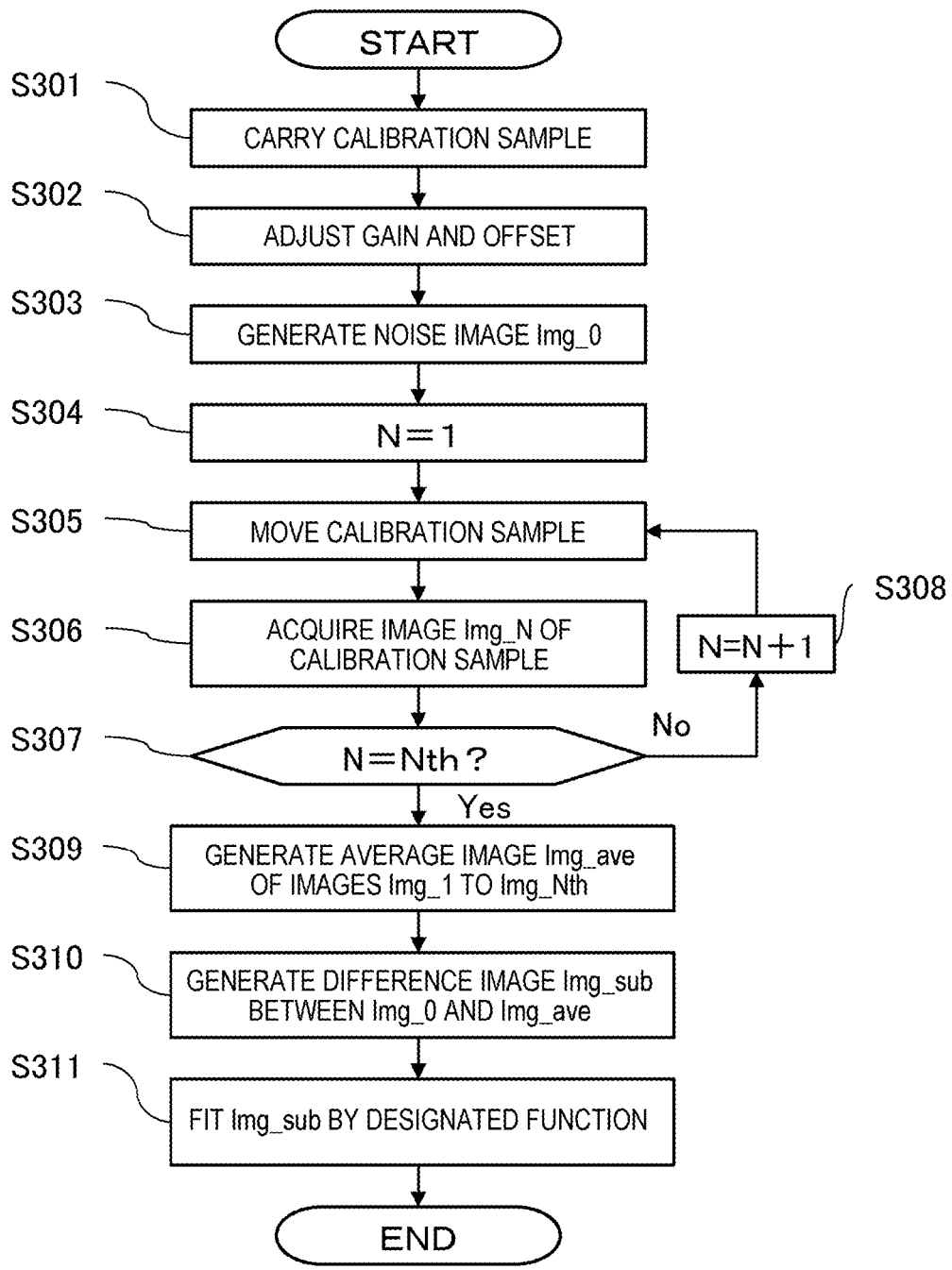
FIG. 3 is a diagram showing a flow of a process of calculating a composite ratio according to the first embodiment.

The composite ratio calculation unit 118 reads a fitting result in S311 of FIG. 3, for example, the coefficients a, b, c, d, e, and f from the storage unit 117.

(S504)

The composite ratio calculation unit 118 uses the fitting result read in S503 to create a composite ratio map in which the composite ratio is mapped to each position in the field of view. When the designated function is Equation 1, a composite ratio map g(Nx, Ny) of the first detector 111 and a composite ratio map h(Nx, Ny) of the second detector 112 are expressed by, for example, the following equations.

$$g(Nx, Ny) = \left(1 - \frac{b}{a} \cdot \exp\left(-\frac{(P \cdot N_X - e)^2}{c} - \frac{(P \cdot N_Y - f)^2}{d}\right)\right) \times 100 \quad \text{Equation 2}$$

$$h(Nx, Ny) = 100 - g(Nx, Ny) \quad \text{Equation 3}$$

Here, (Nx, Ny) is a position of each pixel in a coordinate system with the center of the field of view as the origin, P is a length per pixel, for example, 5 nm/pixel, and a unit of g(Nx, Ny) and h(Nx, Ny) is %. FIG. 6 is a diagram showing an example of the composite ratio map g(Nx, Ny) of the first detector 111.

(S505)

The image generation unit 115 generates a composite image by synthesizing the image of the first detector 111 and the image of the second detector 112 with respect to the observation sample using the composite ratio map created in S504. For example, the following equation is used to generate the composite image.

$$Img12(Nx,Ny) = g(Nx,Ny) \cdot Img1(Nx,Ny) + h(Nx,Ny) \cdot Img2(Nx,Ny) \quad \text{Equation 4}$$

Here, Img1(Nx, Ny) is an image of the first detector 111, Img2(Nx, Ny) is an image of the second detector 112, and Img12 (Nx, Ny) is a composite image.

(S506)

The SEM control unit 119 causes the input/output unit 116 to display the composite image generated in S505 and causes the storage unit 117 to store the composite image.

According to the flow of the process described above, the image of the first detector 111 and the image of the second detector 112, that is, the two angle-discriminated images are synthesized with respect to the observation sample, and thus a composite image in which the shape of the lower layer of the multilayered sample 105 is clear is generated. In addition, since the composite ratio used for generating the composite image is calculated based on the image of the first detector 111 or the image of the second detector 112 with respect to the calibration sample having the flat surface, the composite image having uniform image quality in the field of view is generated.

Second Embodiment

The first embodiment has been described in which the composite ratio is calculated based on the approximate function obtained by approximating the luminance distribution of the image of the first detector 111 or the image of the second detector 112 with respect to the calibration sample having the flat surface with the designated function. In the present embodiment, a scanning electron microscope having a function of adjusting a minor difference of the approximate function obtained from the luminance distribution of the image of the first detector 111 or the image of the second detector 112 will be described.

Figure 7:
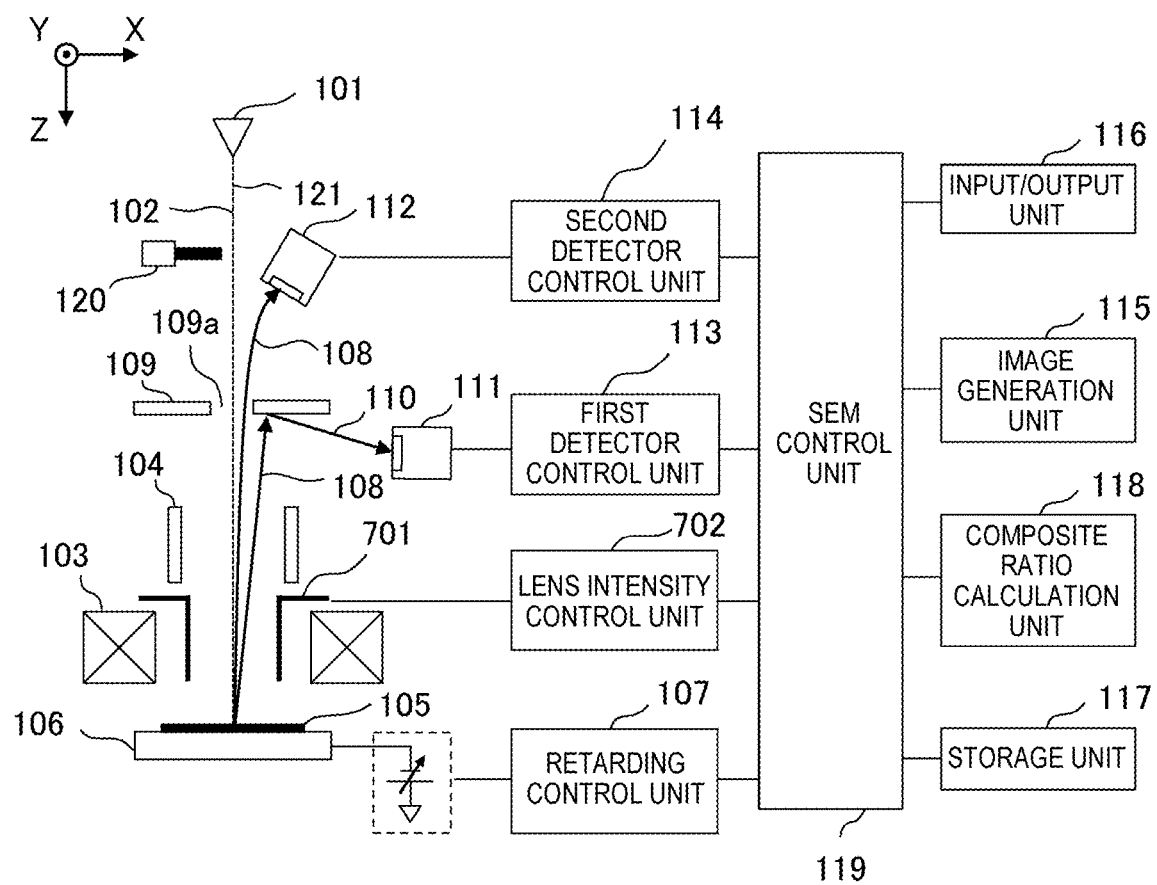
FIG. 7 is a schematic view showing an example of a scanning electron microscope according to a second embodiment.

An example of a configuration of the scanning electron microscope of the present embodiment will be described with reference to FIG. 7. The same configurations as those of the first embodiment are denoted by the same reference numerals, and the description thereof will be omitted. The scanning electron microscope of the present embodiment includes a trajectory control lens 701 and a lens intensity control unit 702 in addition to the configuration of the first embodiment.

The trajectory control lens 701 is a coil or an electrode that is provided between the sample 105 and the deflector 104 and generates a magnetic field or an electric field for controlling trajectories of the secondary electrons 108. The lens intensity control unit 702 is a circuit that controls an intensity of the magnetic field or the electric field generated by the trajectory control lens 701. The intensity of the magnetic field or the electric field for controlling the trajectories of the secondary electrons 108 is controlled by the lens intensity control unit 702, so that a distribution of the secondary electrons 108 passing through the opening 109a of the secondary electron diaphragm 109 changes. That is, by the trajectory control lens 701 and the lens intensity control unit 702 controlling the luminance distribution of the image of the first detector 111 or the image of the second detector 112, the approximate function obtained from the luminance distribution is adjusted.

Figure 8:
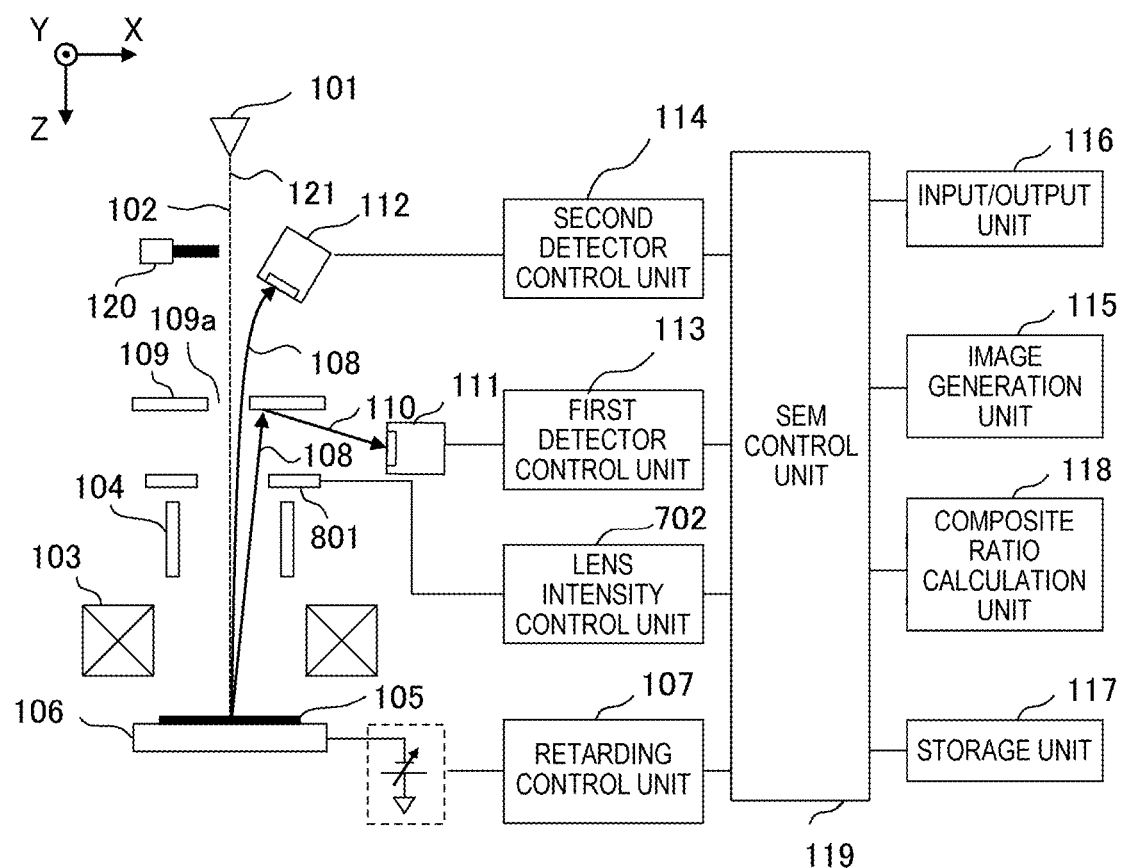
FIG. 8 is a schematic view showing the other example of a scanning electron microscope according to the second embodiment.

The other example of a configuration of the scanning electron microscope of the present embodiment will be described with reference to FIG. 8. In FIG. 8, different from the trajectory control lens 701 in FIG. 7, a trajectory control lens 801 is provided between the deflector 104 and the first detector 111. Similarly to the trajectory control lens 701, the trajectory control lens 801 is also a coil or an electrode that generates the magnetic field or the electric field for controlling the trajectories of the secondary electrons 108, and the intensity of the magnetic field or the electric field is controlled by the lens intensity control unit 702. That is, by the trajectory control lens 801 and the lens intensity control unit 702, the approximate function obtained from the luminance distribution of the image of the first detector 111 or the image of the second detector 112 is adjusted.

Figure 9:
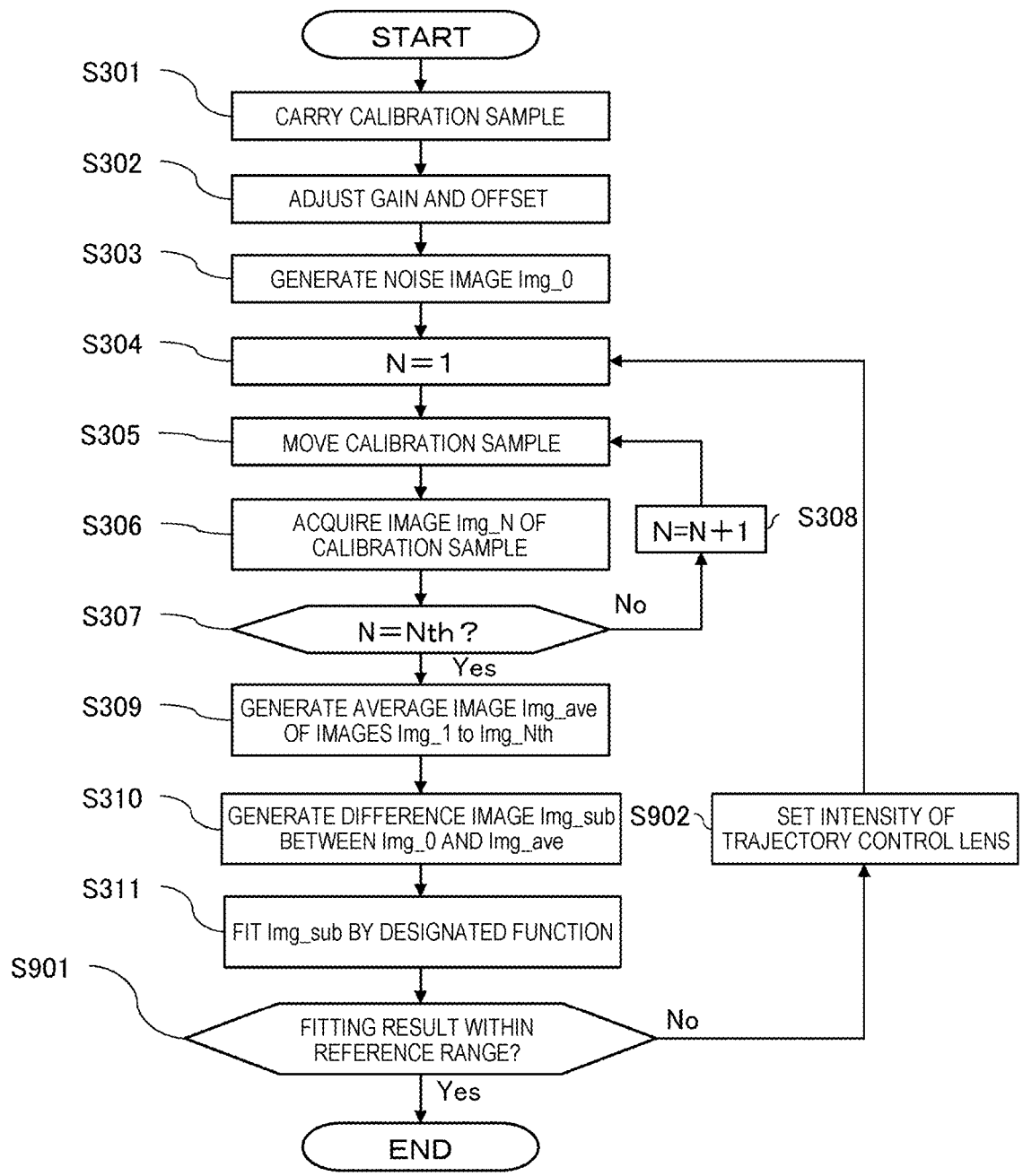
FIG. 9 is a diagram showing a flow of a process of calculating a composite ratio according to the second embodiment.

An example of a flow of a process of calculating a function used for calculation of the composite ratio in the present embodiment will be described with reference to FIG. 9. The same processes as those in FIG. 3 are denoted by the same step numbers, and the description thereof will be omitted.

(S301) to (S311) are the same as in the first embodiment.

(S901)

The SEM control unit 119 determines whether the fitting result in S311 is within a reference range. When the fitting result is not within the reference range, the process proceeds to S902, and when the fitting result is within the reference range, the flow of the process ends. Whether the fitting result is within the reference range is determined by, for example, the following equation.

$$\Delta \geq \iint |f(x,y) - f0(x,y)|^2 dx dy \quad \text{Equation 5}$$

Here, Δ is a predetermined threshold value, f(x, y) is an approximate function obtained as the fitting result, and f0(x, y) is a predetermined reference function. The reference function stored in advance in the storage unit 117 may be read as necessary, or may be set by the operator via the input/output unit 116.

(S902)

The lens intensity control unit 702 sets the intensity of the magnetic field or the electric field generated by the trajectory control lens 701 or the trajectory control lens 801, and the process is returned to S304. The intensity of the magnetic field or the electric field set in this step is preferably set, so that a value of a right side of Equation 5 is small.

According to the flow of the process described above, it is possible to adjust the minor difference of the approximate function obtained from the luminance distribution of the image of the first detector 111 or the image of the second detector 112 with respect to the calibration sample.

Third Embodiment

The first embodiment has been described in which the composite image of the observation sample is generated by using the composite ratio calculated based on the luminance distribution of the image of the calibration sample. There are various types of observation samples, and a charged state of the surface changes according to the type of the observation sample and the observation conditions. Charges of the surface of the sample change the trajectories of the secondary electrons 108, so that the luminance distribution of the angle-discriminated image is changed. Therefore, the present embodiment discloses that the composite ratio changes in accordance with the type of the sample 105 and the observation condition.

Specifically, the function f(x, y) used for calculation of the composite ratio is calculated according to the flow of the process of FIG. 3 for each type of the sample 105 and each observation condition, and is stored in the storage unit 117. The function f(x, y) calculated for each type of the sample 105 and each observation condition and stored in the storage unit 117 is read according to the type of the observation sample and the observation conditions, and is used to generate a composite image.

An example of a graphical user interface (GUI) according to the present embodiment will be described with reference to FIG. 10. The GUI illustrated in FIG. 10 is used when the function f(x, y) for each type of the sample 105 and each observation condition is calculated. The GUI of FIG. 10 includes a sample name display section 1001, an acceleration voltage display section 1002, a probe current display section 1003, a magnification display section 1004, a scanning type display section 1005, a frame number display section 1006, a composite ratio display section 1007, and a calibration availability setting section 1008.

In the sample name display section 1001, a sample name indicating the type of sample is displayed. In the acceleration voltage display section 1002, a voltage at which the primary electron beam 102 is accelerated is displayed. In the probe current display section 1003, a current amount of the primary electron beam 102 is displayed. In the magnification display section 1004, a magnification of the image is displayed. In the scanning type display section 1005, a scanning type is displayed. In the frame number display section 1006, the number of frames of an image is displayed. In the composite ratio display section 1007, a representative value of the composite ratio, for example, the composite ratio set in the center of the field of view is displayed. The calibration availability setting section 1008 sets whether to recalculate the function f(x, y) for the type of the sample 105 and the observation conditions displayed on the GUI of FIG. 10. That is, if a check box of the calibration availability setting section 1008 is checked, the function f(x, y) is recalculated according to the flow of the process of FIG. 3, and is stored in the storage unit 117.

As described above, according to the present embodiment, the function f(x, y) used for calculation of the composite ratio is calculated according to the type of the sample 105 and the observation conditions, and the composite image is generated by using the composite ratio according to the charged state of the observation sample. As a result, even when the surface of the multilayered sample 105 is charged, a composite image in which the shape of the lower layer is clear and the image quality in the field of view is uniform is generated.

A plurality of embodiments of the invention has been described above. The invention is not limited to these embodiments, and may include various modifications. The embodiments described above have been described in detail for easy understanding of the invention, and are not necessarily limited to those including all the configurations described above. A part of the configuration of one embodiment can be replaced with the configuration of another embodiment, and the configuration of another embodiment can be added to the configuration of one embodiment. Further, a part of the configuration of each embodiment may be added to, deleted from, or replaced with another configuration.

What is claimed is:

1. A charged particle beam device, comprising:
   a beam source configured to irradiate a sample with a charged particle beam;
   a diaphragm including an opening used for angle discrimination of secondary charged particles emitted from the sample;
   a first detector provided closer to the sample than the diaphragm, and configured to detect a part of the secondary charged particles;
   a second detector provided closer to the beam source than the diaphragm, and configured to detect secondary charged particles passing through the opening;
   an image generation unit configured to generate an image based on a first signal output from the first detector or a second signal output from the second detector; and
   a composite ratio calculation unit configured to calculate a composite ratio for each position in a field of view based on the first signal or the second signal with respect to a calibration sample that is a sample having a flat surface, wherein
   the image generation unit generates a composite image by synthesizing the first signal and the second signal with respect to an observation sample using the composite ratio.

2. The charged particle beam device according to claim 1, wherein
   the composite ratio calculation unit is configured to calculate the composite ratio by using an approximate function obtained by approximating a distribution of the first signal or the second signal with respect to the calibration sample with a designated function.

3. The charged particle beam device according to claim 2, further comprising:
   a trajectory control lens configured to control a trajectory of the secondary charged particles between the sample and the first detector; and a lens intensity control unit configured to control a lens intensity of the trajectory control lens, so that a difference between a predetermined reference function and the approximate function is equal to or less than a threshold value.

4. The charged particle beam device according to claim 3, further comprising:

an input/output unit configured to set the reference function.

5. The charged particle beam device according to claim 2, wherein the designated function is a Gaussian function.

\* \* \* \* \*